(12) United States Patent
Warrington et al.

(10) Patent No.: US 9,191,008 B2
(45) Date of Patent: Nov. 17, 2015

(54) DUAL USE DELAY CAPACITOR

(75) Inventors: Allan Richard Warrington, Chislehurst (GB); Andy LeFevre, Dunmow (GB)

(73) Assignee: Intersil Americas LLC, Milpitas, CA (US)

( * ) Notice: Subject to any disclaimer, the term of this patent is extended or adjusted under 35 U.S.C. 154(b) by 962 days.

(21) Appl. No.: 12/430,172

(22) Filed: Apr. 27, 2009

(65) Prior Publication Data

US 2009/0322306 A1    Dec. 31, 2009

Related U.S. Application Data

(60) Provisional application No. 61/075,389, filed on Jun. 25, 2008.

(51) Int. Cl.
| H03H 11/26 | (2006.01) |
| H03K 19/173 | (2006.01) |
| H03K 5/13 | (2014.01) |
| H03K 17/22 | (2006.01) |
| H03K 5/00 | (2006.01) |

(52) U.S. Cl.
CPC .............. *H03K 19/1732* (2013.01); *H03K 5/13* (2013.01); *H03K 17/22* (2013.01); *H03K 2005/00156* (2013.01)

(58) Field of Classification Search
CPC .................................. H01J 13/34; H01J 13/48
See application file for complete search history.

(56) References Cited

U.S. PATENT DOCUMENTS

| 4,945,413 | A  * | 7/1990  | Merval et al. ................. 348/542 |
| 5,416,437 | A    | 5/1995  | Contreras et al. |
| 5,761,458 | A    | 6/1998  | Young et al. |
| 6,040,714 | A    | 3/2000  | Klein |
| 6,249,159 | B1 * | 6/2001  | Johnson ........................ 327/157 |
| 6,331,977 | B1   | 12/2001 | Spaderna et al. |
| 6,429,682 | B1   | 8/2002  | Schultz et al. |
| 6,496,046 | B2 * | 12/2002 | Johnson ........................ 327/157 |
| 6,705,694 | B1 * | 3/2004  | Barbour et al. .................... 347/9 |
| 6,731,708 | B1 * | 5/2004  | Watanabe ..................... 375/357 |
| 7,116,948 | B2 * | 10/2006 | Chien ........................ 455/115.3 |
| 7,138,880 | B2 * | 11/2006 | Ma et al. ........................ 331/143 |
| 7,199,607 | B2   | 4/2007  | Volkening et al. |
| 7,276,977 | B2 * | 10/2007 | Self ................................. 331/11 |
| 7,826,801 | B2 * | 11/2010 | Baik et al. ........................ 455/69 |

OTHER PUBLICATIONS

LM1577/LM2577, Simple Switcher® Step-Up Voltage Regulator, National Semiconductor Corporation, DS011468, Apr. 2005, pagers 31.
Carl Nelson, Application Note 19, LT1070 Design Manual, Linear Technology Corporation, Jun. 1986, pp. 80.

* cited by examiner

*Primary Examiner* — Sibin Chen
(74) *Attorney, Agent, or Firm* — Lane Powell PC

(57) ABSTRACT

An integrated circuit comprises a control input providing a connection to a capacitor. A delay circuit generates a delayed enable signal responsive to a provided enable signal. A second circuit performs a control function. A switching circuit responsive to the delayed enable signal connects the control input to the delay circuit in a first mode of operation and connects the control input to the second circuit in a second mode of operation.

17 Claims, 3 Drawing Sheets

DUAL USE DELAY CAPACITOR

PRIORITY CLAIM

This application claims benefit of U.S. Provisional Patent Application Ser. No. 61/075,389 filed Jun. 25, 2008 and entitled DUAL USE OF DELAY CAPACITOR, the specification of which is incorporated herein by reference in its entirety.

BRIEF DESCRIPTION OF THE DRAWINGS

For a more complete understanding, reference is now made to the following description taken in conjunction with the accompanying Drawings in which.

DETAILED DESCRIPTION

Figure 1:
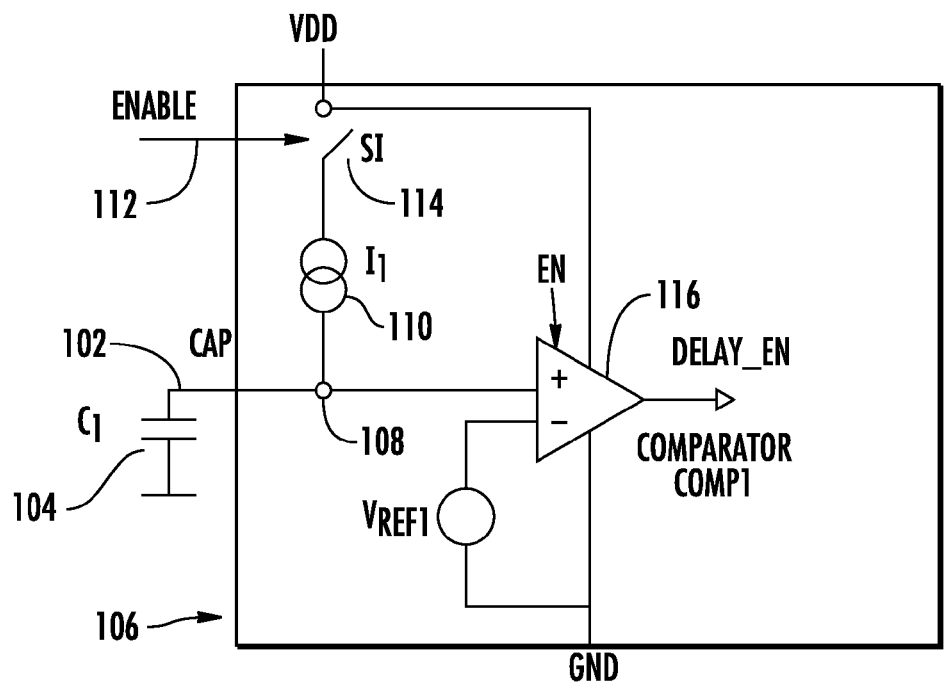
FIG. 1 is an illustration of a delay circuit.

Referring now to the drawings, wherein like reference numbers are used herein to designate like elements throughout, the various views and embodiments of a dual use delay capacitor are illustrated and described, and other possible embodiments are described. The figures are not necessarily drawn to scale, and in some instances the drawings have been exaggerated and/or simplified in places for illustrative purposes only. One of ordinary skill in the art will appreciate the many possible applications and variations based on the following examples of possible embodiments.

Within power management integrated circuits a sufficient number of output pins are required for the functionalities provided within the integrated circuit. Within the circuit there are pins dedicated to delay functionalities and pins dedicated to analog circuit function such as amplifier compensation. Customers may require an integrated circuit manufacturer to provide a large number of functionalities within a particular package/pin count in order to save on manufacturing costs. This may cause a situation where there are insufficient pins available to enable all of the desired functionalities within the integrated circuit. If a feature cannot be achieved, and this feature is necessary for the operation of an integrated circuit, a circuit designer has the option of implementing the feature on-chip, which would require considerable additional chip area and the associated costs, or alternatively, the designer can relax the specification of the chip so that the features can be eliminated.

Figure 2:
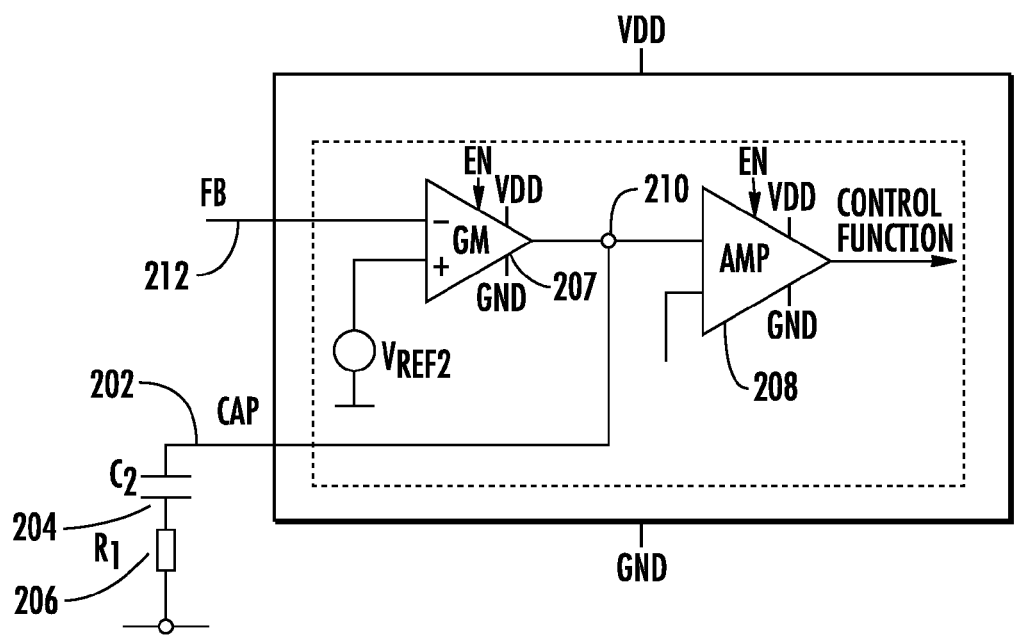
FIG. 2 is an illustration of a compensation circuit.

FIGS. 1 and 2 illustrate the use of an external pin and capacitor for two different examples of chip implemented functionalities. FIG. 1 illustrates the use of an output pin 102 and associated capacitor 104 with a delay circuit of an integrated circuit 106. The delay circuit of FIG. 1 is connected to the output pin 102 at node 108. A current source 110 sources a current into node 108 to charge the capacitor 104 connected to pin 102. The current source 110 is enabled via an enable signal provided at an enable pin 112. The enable signal causes a switch S1 114 to close connecting the current source 110 to system power VDD. Node 108 is also connected with the non-inverting input of a comparator 116. The comparator 116 is connected at its inverting input a reference voltage VREF1. The comparator 116 compares the voltage across capacitor 104 at node 108 with the reference voltage VREF1 to determine when the voltage across capacitor 104 exceeds the voltage VREF1. When this occurs, the output DELAY_EN signal goes to a logical "high" level. From the time that the enable signal applied at input pin 112 goes high, there is a time delay of $T_{DEL}$ that occurs before the DELAY_EN signal at the output of comparator 116 goes high. The delay time $T_{DEL}$ may be determined according to the equation $(C_1 \times V_{REF1})/I_1$.

The circuit illustrated in FIG. 1 is one of many functions that are used within an integrated circuit 106 using an external output pin 102 and associated external components such as a capacitor C1 104. The delay circuit is typically used in a power sequence. Quite often the external pin 102 is dedicated to a delay function that is used only at the start of a power-on sequence when the chip is first enabled, and the pin 102 is no longer used by the integrated circuit 104 after completion of the power-on process. The value of the external capacitor 104 can be changed in order to change the delay time provided by the delay circuit. Typically, an external capacitor 104 is connected to a delay pin 102 and an internal current source 110 is used to ramp the voltage up to the external capacitor. When this voltage reaches a certain threshold level established by the value of $V_{REF1}$, the state of the output of the comparator 116 changes. This output is used to enable some function upon the integrated circuit 106, and the pin 102 becomes dormant until the next time the chip is disabled/enabled and a new power-on sequence begins.

Referring now to FIG. 2, there is illustrated the use of the external pin 202 and a capacitor C2 204 as a compensation network. The capacitor 204 is connected in series with a resistor R1 206 between the external pin 202 and ground. The capacitor 204 and resistor 206 are used as part of a compensation network for amplifiers 207 and 208. The capacitor 204 and resistor 206 are connected at node 210 which is at the output of GM amplifier 207 and at one of the inputs of amplifier 208. The inverting input of amplifier 207 is connected to the FB pin 212. The non-inverting input of amplifier 207 is connected to receive a reference voltage $V_{REF2}$. The capacitor 204 and resistor 206 are used to shape the frequency response of a closed loop system so that there is sufficient phase margin for stable operations of the amplifiers 207 and 208 to be maintained. These external compensation components are selected to optimize the compensation of the circuit. Thus in FIG. 2, pin 202 is being used for compensation, with the capacitor 204 and resistor 206 being part of a compensation network for the amplifiers.

Figure 3:
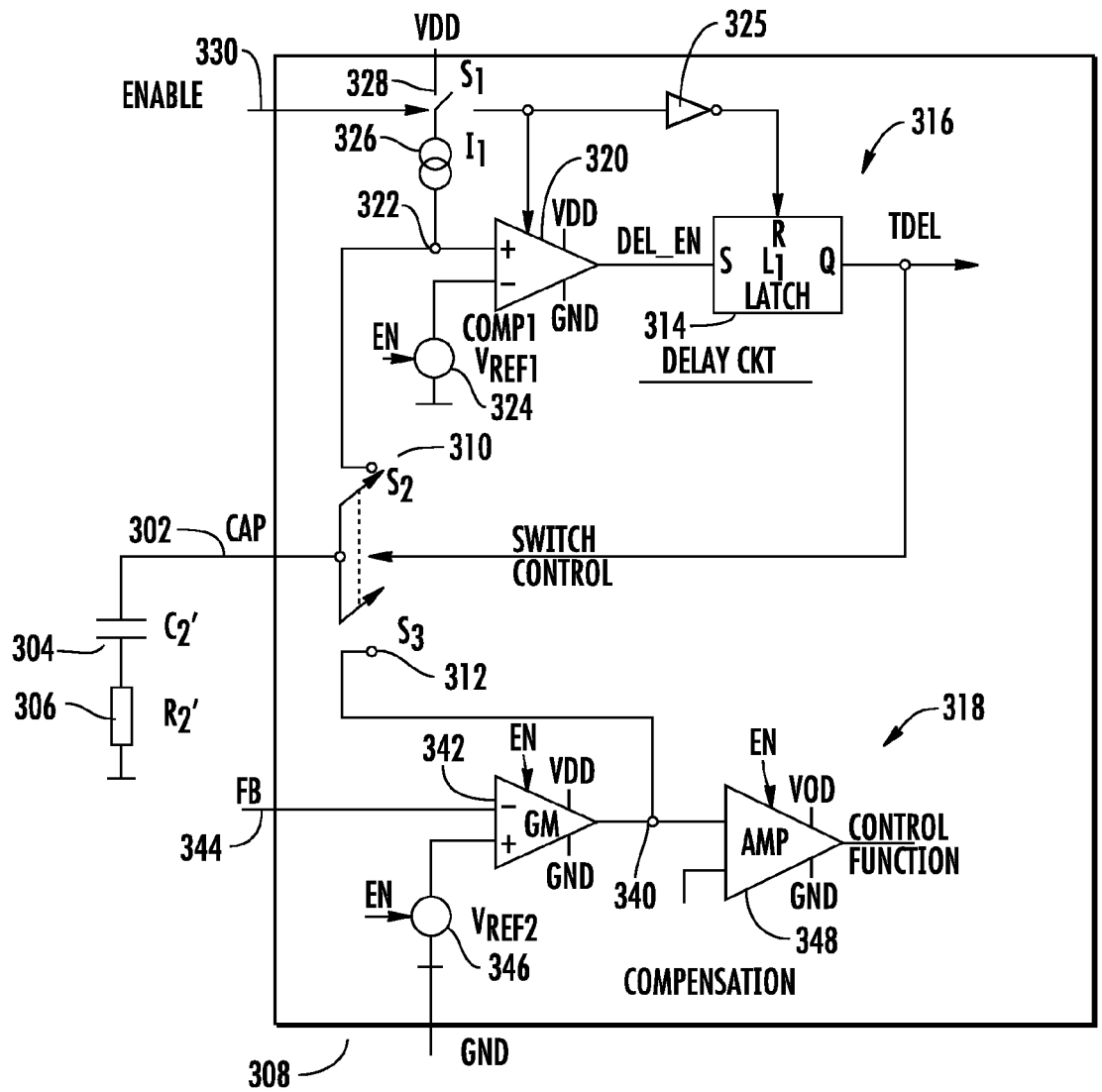
FIG. 3 is an illustration of an output pin and associated capacitor capable of use for multiple functionalities within an integrated circuit.

Referring now to FIG. 3, there is illustrated a schematic diagram wherein an external control pin 302 and an external capacitor C2 304 in series with a resistor R2 306 are used for dual functions as both a delay circuit and a compensation circuit with respect to an integrated circuit device 308. The capacitor 304 and resistor 306 are connected in series between the control pin 302 and ground. The pin 302 is connected to a pair of switches S2 310 and S3 312. The switches 310 and 312 are controlled by a switch control signal $T_{DEL}$ provided from the output of a latch circuit 314. Switch 310 connects the capacitor 304 and control pin 302 to a delay circuit 316. The switch 312 connects the control pin 302 and capacitor 304 to a compensation circuit 318.

The delay circuit 316 comprises a comparator 320 having its non-inverting input connected to node 322 which is connected with switch 310. The inverting input of comparator 320 is connected to a reference voltage source $V_{REF1}$ 324. A current source 326 is connected between a switch 328 and node 322. Switch 328 is responsive to an ENABLE signal provided at control pin 330 and connects the current source 326 to system power $V_{DD}$ responsive to a logical "high" level on control pin 330. The current source 326 provides a charging current to capacitor 304 when switch 310 is closed connecting pin 302 with node 322. The ENABLE signal additionally enables the reference voltage source $V_{REF1}$ 324. The ENABLE signal is applied through an inverter 325 to the reset input of latch circuit 314. The output of the comparator 320 provides a delay enable signal (DEL_EN) to a latch circuit 314. The output of the latch circuit 314 provides the delay signal $T_{DEL}$ that controls the operation of switches 310 and 312.

In a power-on or enable sequence, switch 310 is closed and switch 312 is open to connect pin 302 to the delay circuit 316. Once the ENABLE signal actuates the delay circuit by closing the switch 328, the current source 326 begins charging capacitor 304 through the control pin 302. Once the capacitor 304 has been charged to a sufficient level such that the voltage at node 322 is greater than or equal to the voltage $V_{REF1}$, the output of the comparator 320 will drive the DEL_EN signal to a logical "high" level and apply this signal to the S input of latch circuit 314. The output Q of the latch circuit 314 will also be driven to a logical "high" level which is applied to the switches 310 and 312 connected with control pin 302. Once the $T_{DEL}$ signal goes to a logical "high" level, switch 310 is opened and switch 312 is closed to connect the control pin 302 to the compensation circuit 318.

Switch 312 connects control pin 302 to the compensation circuit at node 340. An amplifier 342 has its output connected to node 340. The inverting input of amplifier 342 is connected to the FB pin 344. The non-inverting input of amplifier 342 is connected to a reference voltage source $V_{REF2}$ 346. The reference voltage source 346 for $V_{REF2}$ is enabled by the ENABLE signal. Node 340 also provides one input to an amplifier circuit 348. The output of the amplifier 348 provides some type of control function output.

Thus, once the external pin 302 has finished being used for the delay function with delay circuit 316 as indicated by the $T_{DEL}$ signal going to a logical "high" level, switch 310 is opened and switch 312 is closed to connect the external pin 302 to the compensation circuit 318. The external pin 302 and compensation network consisting of capacitor 304 and resistor 306 are now connected to the compensation network 318 at node 340. The value of the resistor 306 is chosen to have a negligible effect upon the delay circuit 316. External control pins such as pin 302 that provide a one off delay function (i.e., are used for a short period of time when the chip is first enabled and then remain in the dormant state until the next power/enable cycle) are suitable candidates for being used for an additional purpose once the pins normal functions have been completed. Thus, once the control pin's 302 normal function has been completed, (e.g., the delay function), the internal switches 310 and 312 disconnect the external capacitor from the delay circuit and connect the pin to the amplifier to be compensated. The dual use of the external capacitor 304 requires that the capacitor be set to a suitable value to operate within both operations. This can normally be accommodated in a delay block by scaling the applied ramp current $I_1$ to a suitable level to drive the compensation capacitor to achieve the desired delay.

Figure 4:
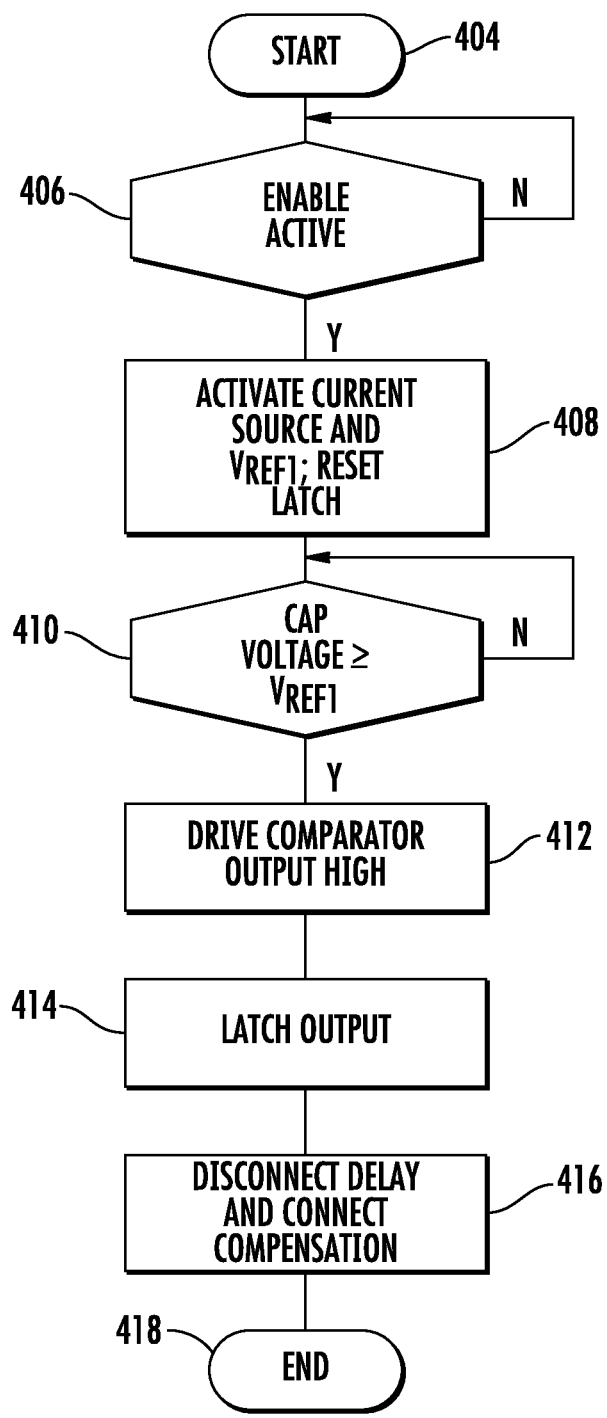
FIG. 4 is a flow diagram describing the operation of the circuit of FIG. 3.

Referring now to FIG. 4, there is a flow diagram describing the operation of the circuit of FIG. 3. The process is initiated at step 404 by a power-on or enable process being initiated. Inquiry step 406 determines whether the ENABLE signal is active. If not, inquiry step 406 continues to monitor for an active ENABLE signal. Once an active ENABLE signal is detected, latch 316 is reset causing its Q output to a logical low level. The ENABLE signal also causes a current source $I_1$ 110 and the $V_{REF1}$ reference voltage to be turned on, as well as enabling comparator 320 at step 408. Voltage source $V_{REF1}$ is directly actuated by the ENABLE signal while current source 326 is actuated by the closing of switch 328 to connect the current source with system power $V_{DD}$. Next, inquiry step 410 determines whether the capacitance voltage of capacitor 304 measured at node 322 is greater than or equal to the reference voltage $V_{REF1}$. If not, the process remains at inquiry step 410. Once the capacitance voltage at node 322 is greater than or equal to the reference voltage $V_{REF1}$, the output of the comparator 320 is driven to a logical "high" level at step 412. This output is latched at the logical "high" level at step 414 by the latch circuit 314. This causes the $T_{DEL}$ signal to disconnect the delay circuit 316 from control pin 302 and connect the compensation circuit 318 to the control pin 302 at step 416. This is accomplished by opening switch 310 and closing switch 312. The process is completed at step 418 until a next power-on or enable process is initiated at step 404.

While the above description has described using the control pin 302 and associated capacitor 304 with respect to a compensation circuit once the delay functionality of the delay circuit 316 has been completed, it will be appreciated that other uses of the capacitor 304 and control pin 302 may be utilized by an associated integrated circuit 308 once the use of the control pin 302 and capacitor 304 for a delay functionality has been completed. This will provide the opportunity for control pins 302 and associated external circuitry to be used for a variety of functions that will increase the capabilities of an associated integrated circuit without requiring additional on-chip area to be devoted to a newly provided functionality or to require additional output or control pins to implement the additional functionalities.

It will be appreciated by those skilled in the art having the benefit of this disclosure that this disclosure provides a dual use delay capacitor. It should be understood that the drawings and detailed description herein are to be regarded in an illustrative rather than a restrictive manner, and are not intended to be limiting to the particular forms and examples disclosed. On the contrary, included are any further modifications, changes, rearrangements, substitutions, alternatives, design choices, and embodiments apparent to those of ordinary skill in the art, without departing from the spirit and scope hereof, as defined by the following claims. Thus, it is intended that the following claims be interpreted to embrace all such further modifications, changes, rearrangements, substitutions, alternatives, design choices, and embodiments.

What is claimed is:

1. An integrated circuit, comprising:
    an external control pin for providing connections to a capacitor external to the integrated circuit;
    a delay circuit for generating a delayed enable signal during a first mode of operation by delaying an enable signal applied to the delay circuit;
    a second circuit for performing a control function in a second mode of operation after completion of the first mode of operation; and
    a switching circuit responsive to the delayed enable signal for connecting the external control pin to the delay circuit and disconnecting the external control pin from the second circuit in the first mode of operation and for connecting the external control pin to the second circuit and disconnecting the external control pin from the delay circuit in the second mode of operation, the second mode of operation occurring after the first mode of operation.

2. An integrated circuit, comprising:
    an external control pin for providing connections to a capacitor external to the integrated circuit;

a delay circuit for generating a delayed enable signal during a first mode of operation responsive to an enable signal at to the delay circuit;

a second circuit for performing a control function in a second mode of operation after completion of the first mode of operation;

a switching circuit responsive to the delayed enable signal for connecting the external control pin to the delay circuit and disconnecting the external control pin from the second circuit in the first mode of a operation and for connecting the external control pin to the second circuit and disconnecting the external control pin from the delay circuit in the second mode of operation, the second mode of operation occurring after the first mode of operation; and wherein the delay circuit further comprises
a current source for providing a charging current to the external control pin responsive to the enable signal; and
a comparator for comparing a voltage at the external control pin with a reference voltage and generating the delayed enable signal responsive thereto.

3. The integrated circuit of claim 2, wherein the delay circuit further comprises a latch circuit for latching the delayed enable signal from the comparator to a present state.

4. An integrated circuit, comprising:
an external control pin for providing connections to a capacitor external to the integrated circuit;
a delay circuit for generating a delayed enable signal during a first mode of operation responsive to an enable signal at to the delay circuit;
a second circuit for performing a control function in a second mode of operation after completion of the first mode of operation;
a switching circuit responsive to the delayed enable signal for connecting the external control pin to the delay circuit and disconnecting the external control pin from the second circuit in the first mode of a operation and for connecting the external control pin to the second circuit and disconnecting the external control pin from the delay circuit in the second mode of operation, the second mode of operation occurring after the first mode of operation; and
wherein the switching circuit further comprises
a first switch responsive to the delayed enable signal;
a second switch responsive to the delayed enable signal; and
wherein the first switch is closed and the second switch is opened in the first mode of operation and the first switch is opened and the second switch is closed in the second mode of operation.

5. An integrated circuit, comprising:
an external control pin for providing connections to a capacitor external to the integrated circuit;
a delay circuit for generating a delayed enable signal during a first mode of operation responsive to an enable signal at to the delay circuit;
a second circuit for performing a control function in a second mode of operation after completion of the first mode of operation;
a switching circuit responsive to the delayed enable signal for connecting the external control pin to the delay circuit and disconnecting the external control pin from the second circuit in the first mode of a operation and for connecting the external control pin to the second circuit and disconnecting the external control pin from the delay circuit in the second mode of operation, the second mode of operation occurring after the first mode of operation; and wherein the second circuit comprises an amplifier and the external control pin provides a connection to a compensation circuit external to the integrated circuit for the amplifier in the second mode of operation, wherein the compensation circuit includes the capacitor.

6. An apparatus, comprising:
an integrated circuit including a control input;
a capacitor connected with the control input;
a resistor connected in series with the capacitor;
wherein the integrated circuit further comprises
a current source for providing a charging current to the control input responsive to an enable signal;
a comparator for comparing a voltage at the control input with a reference voltage and generating a delayed enable signal responsive thereto;
a latch circuit for latching the delayed enable signal from the comparator to a present state;
a control circuit for performing a control function; and
a switching circuit responsive to the delayed enable signal for connecting the control input to the comparator in a first mode of operation and for connecting the control input to the control circuit in a second mode of operation, wherein the switching circuit further comprises
a first switch responsive to the delayed enable signal;
a second switch responsive to the delayed enable signal; and
wherein the first switch is closed and the second switch is opened in the first mode of operation and the first switch is opened and the second switch is closed in the second mode of operation.

7. The apparatus of claim 6, wherein the second circuit comprises at least one amplifier.

8. The apparatus of claim 6, wherein the capacitor and the resistor comprise a compensation network for the second circuit in the second mode of operation.

9. The apparatus of claim 6, wherein the resistor has a value having negligible effect on an operation the comparator and the current source during the first mode of operation.

10. The apparatus of claim 6 wherein:
the control input is connected to an external pin of the integrated circuit; and
the capacitor is connected with the external pin.

11. The apparatus of claim 6 wherein:
the control input includes an external pin of the integrated circuit; and
the capacitor is connected with the external pin.

12. A method for providing an external control pin of an integrated circuit having dual modes of operation, comprising the steps of:
connecting the external control pin, connected to an external capacitor, to a delay circuit of the integrated circuit;
receiving an enable signal at an enable input of the integrated circuit;
generating a delayed version of the enable signal using the delay circuit connected to the external capacitor responsive to the enable signal in a first mode of operation;
switching the external control pin from the delay circuit in the first mode of operation to a second control circuit in a second mode of operation responsive to the delayed enable signal after completion of the first mode of operation; and performing a control function using the second control circuit connected with the capacitor via the external control pin in the second mode of operation.

13. The method of claim 12, wherein the step of switching further comprises the steps of:
   connecting the delay circuit to the external control pin in the first mode of operation; and
   disconnecting the second control circuit from the external control pin in the first mode of operation.

14. The method of claim 13, wherein the step of switching further comprises the steps of:
   disconnecting the delay circuit from the external control pin in the second mode of operation; and
   connecting the second control circuit to the external control pin in the second mode of operation.

15. The method of claim 12, wherein the step of performing further comprises the step of providing the capacitor to the second control circuit as a compensation network.

16. A method for providing an external control pin of an integrated circuit having dual modes of operation, comprising the steps of:
   connecting the external control pin, connected to an external capacitor, to a delay circuit of the integrated circuit;
   receiving an enable signal at an enable input of the integrated circuit;
   generating a delayed enable signal using the delay circuit connected to the external capacitor responsive to the enable signal in a first mode of operation;
   switching the external control pin from the delay circuit in the first mode of operation to a second control circuit in a second mode of operation responsive to the delayed enable signal after completion of the first mode of operation;
   performing a control function using the second control circuit connected with the capacitor via the external control pin in the second mode of operation; and
   wherein the step of generating further comprises the steps of
      enabling a current source responsive to the enable signal;
      charging the capacitor through the external control pin to a voltage responsive to a charge current from the current source;
      comparing the voltage at the external control pin with a reference voltage; and
      generating the delayed enable signal responsive to the comparison.

17. The method of claim 16, wherein the step of generating the delayed enable signal further comprises the step of latching an output of a comparator performing the step of comparing to a present state.

* * * * *

UNITED STATES PATENT AND TRADEMARK OFFICE
CERTIFICATE OF CORRECTION

PATENT NO. : 9,191,008 B2  
APPLICATION NO. : 12/430172  
DATED : November 17, 2015  
INVENTOR(S) : Allan Richard Warrington and Andy LeFevre Page 1 of 1

It is certified that error appears in the above-identified patent and that said Letters Patent is hereby corrected as shown below:

In the Claims

In Claim 2, Column 5, Line 3 of the patent, the phrase "signal at to the delay circuit;" should read —signal applied to the delay circuit;—

In Claim 4, Column 5, Line 31 of the patent, the phrase "signal at to the delay circuit;" should read —signal applied to the delay circuit;—

In Claim 4, Column 5, Line 38 of the patent, please delete the text "a"

In Claim 5, Column 5, Line 57 of the patent, the phrase "signal at to the delay circuit;" should read —signal applied to the delay circuit;—

In Claim 5, Column 5, Line 64 of the patent, please delete the text "a"

Signed and Sealed this  
Twelfth Day of July, 2016

Michelle K. Lee  
*Director of the United States Patent and Trademark Office*